United States Patent [19]

Kiya et al.

[11] Patent Number: 4,899,348
[45] Date of Patent: Feb. 6, 1990

[54] METHOD AND APPARATUS FOR CONTROLLING OPTICAL OUTPUT OF LASER LIGHT SOURCE

[75] Inventors: Yukitoshi Kiya, Kawasaki; Kazuyuki Shimada, Chofu, both of Japan

[73] Assignee: Ricoh Company, Ltd., Tokyo, Japan

[21] Appl. No.: 287,335

[22] Filed: Dec. 20, 1988

[30] Foreign Application Priority Data

Dec. 29, 1987 [JP] Japan ................................. 62-336548
Jan. 27, 1988 [JP] Japan ................................. 63-14560

[51] Int. Cl.⁴ .............................................. H01S 3/00
[52] U.S. Cl. ........................................... 372/38; 372/9
[58] Field of Search .................... 372/29, 31, 32, 9, 38

[56] References Cited

U.S. PATENT DOCUMENTS 4,618,958 10/1986 Shibata et al. ........................ 372/29
4,662,760  5/1987 Shmada et al. ....................... 378/31
4,663,760  5/1987 Shimada ................................ 372/31
4,763,334  8/1988 Shimada et al. ...................... 378/38

Primary Examiner—Léon Scott, Jr.
Attorney, Agent, or Firm—Cooper & Dunham

[57] ABSTRACT

A method of controlling an optical output of a laser light source which scans a photosensitive body comprises the steps of detecting an optical output of the laser light source and generating a monitor signal which has a logic level indicative of whether a laser power of the optical output is greater than or less than a predetermined value, generating signals including a gate signal indicative of a scan time in which the photosensitive body is scanned based on a synchronization detection signal indicative of each scanning line, a laser diode signal having logic levels for turning the laser light source ON and OFF and an enable signal based on the monitor signal, the gate signal and a power set start signal indicative of a start of a power set operation in which the laser power is controlled to the predetermined value, and adjusting a driving current supplied to the laser light source based on the monitor signal when enabled by a certain logic level of the enable signal so as to control the laser power to the determined value.

9 Claims, 8 Drawing Sheets

METHOD AND APPARATUS FOR CONTROLLING OPTICAL OUTPUT OF LASER LIGHT SOURCE

BACKGROUND OF THE INVENTION

The present invention generally relates to methods and apparatuses for controlling optical output of a laser light source, and more particularly to a method and an apparatus for controlling an optical output of a laster light source in an image forming apparatus such as a laser printer having a laser power set mechanism.

With an increase in printing speed and printing density of the laser printer, a rotational speed of a laser beam deflector such as a polygonal mirror is becoming quite high. As a result, a scan time of one scanning line is becoming short, and a scan time of a non-photosensitive region within a laser scanning region is becoming short.

A reference clock signal of a laser power set mechanism which sets a laser power of a laser light source, that is, a counting speed of an up/down counter, is uniquely determined by a response of a power monitor part which monitors an optical output of the laser light source. A laser diode constituting the laser light source is turned ON during a laser power set operation, and in order to prevent a photosensitive body from becoming deteriorated, it is desirable that the power set operation is carried out within a scan time in which a non-photosensitive region is scanned. However, as described above, the scan time of the non-photosensitive region is becoming short due to the increase in both the printing speed and the printing density of the laser printer, and there is a problem in that the power set operation cannot be completed within the scan time of the non-photosensitive region. In other words, it is becoming more and more difficult to adjust or readjust the laser power to a predetermined value.

Conventionally, there is a method of carrying out a power set operation with respect to the laser light source by use of signals having timings shown in FIGS. 1(A) and 1(G). When a power set start signal c shown in FIG. 1(C) from a central processing unit (CPU, not shown) is supplied to an enable signal generator (not shown), an enable signal g shown in FIG. 1(G) is set to a high level (g1) and a laser diode signal f shown in FIG. 1(F) is set to a high level (f1) to turn the laser diode ON. When a monitor signal d shown in FIG. 1(D) changes from a low level to a high level (d1), an end signal e shown in FIG. 1(E) from an end signal generator (not shown) turns the laser diode OFF by setting the laser diode signal f to a low level (f2). At the same time, the enable signal g is also set to a low level (g2) to end the ON state of the laser diode.

In other words, the power set operation is carried out regardless of whether it is a high-level period of a gate signal b shown in FIG. 1(B) indicating a scan time of a photosensitive region or a low-level period of the gate signal b indicating a scan time of a non-photosensitive region. For this reason, there is a problem in that a specific portion of the photosensitive body becomes deteriorated by the exposure which takes place due to the power set operation carried out within one scanning line which is indicated by an interval between signals portions a1 and a2 of a synchronization detection signal a shown in FIG. 1(A).

Even when realizing the high-speed printing with the high printing density, it is important that the photosensitive body is exposed uniformly by the power set operation. But according to the conventional method, the exposure by the laser beam takes place within one scanning line at a specific portion of the photosensitive body and not uniformly on the photosensitive body because the power set operation is carried out regardless of whether the region being scanned is the photosensitive region or the non-photosenstive region.

In addition, even among laser printers of the same model but of different picture element densities, an optimum timing of the power set operation differs depending on the picture element density. That is, as the picture element density becomes high (the rotational speed of the deflector becomes high), the scan time of the non-photosensitive region becomes short and there is a problem in that the power set operation cannot be completed within this scan time of the non-photosensitive region.

SUMMARY OF THE INVENTION

Accordingly, it is a general object of the present invention to provide novel and useful method and apparatus for controlling an optical output of a laser light source, in which the problems described above are eliminated.

Another and more specific object of the present invention is to provide a method of controlling an optical output of a laser light source which scans a photosensitive body, comprising the steps of detecting an optical output of the laser light source and generating a monitor signal which has a logic level indicative of whether a laser power of the optical output is greater than or less than a predetermined value, generating signals including a gate signal indicative of a scan time in which the photosensitive body is scanned based on a synchronization detection signal indicative of each scanning line, a laser diode signal having logic levels for turning the laser light source ON and OFF and an enable signal based on the monitor signal, the gate signal and a power set start signal indicative of a start of a power set operation in which the laser power is controlled to the predetermined value, and adjusting a driving current supplied to the laser light source based on the monitor signal when enabled by a certain logic level of the enable signal so as to control the laser power to the predetermined value. The laser diode signal has a logic level for turning the laser light source ON only during a time in which the gate signal has a predetermined logic level corresponding to the scan time in which the photosensitive body is scanned, and the enable signal has the certain logic level for enabling the adjustment of the driving current only when the gate signal has the predetermined logic level until the logic level of the monitor signal undergoes two successive transitions. According to the method of the present invention, it is possible to control the logic level of the laser diode signal based on the gate signal so that the exposure takes place uniformly on the photosensitive body during the power set operation. Hence, it is possible to prevent a specific portion of the photosensitive body from becoming deteriorated and thus prevent an abnormal image formation which would occur if such a deterioration occurs. In addition, it is possible to expose the photosensitive body for the power set operation regardless of whether or not the power adjustment is completed at an intermediate portion of the photosensitive region.

Still another object of the present invention is to provide a method of controlling an optical output of a laser light source which scans a photosensitive body, comprising the steps of detecting an optical output of the laser light source and generating a monitor signal which has a logic level indicative of whether a laser power of the optical output is greater than or less than a predetermined value, generating signals including a gate signal indicative of a scan time in which the photosensitive body is scanned based on a synchronization detection signal indicative of each scanning line, first and second laser diode signals respectively having logic levels for turning the laser light source ON and OFF and first and second enable signals based on the monitor signal, the gate signal and a power set start signal indicative of a start of a power set operation in which the laser power is controlled to the predetermined value, selectively outtputting the first laser diode signal and the first enable signal respectively as a selected laser diode signal and a selected enable signal in a first mode and outputting the second laser diode signal and the second enable signal respectively as the selected laser diode signal and the selected enable signal in a second mode, and adjusting a driving current supplied to the laser light source based on the monitor signal when enabled by a certain logic level of the selected enable signal so as to control the laser power to the predetermined value. The first laser diode signal has a logic level for turning the laser light source ON only during a time in which the gate signal has a predetermined logic level corresponding to the scan time in which the photosensitive body is scanned, and the first enable signal has the certain logic level for enabling the adjustment of the driving current only when the gate signal has the predetermined logic level unit the logic level of the monitor signal undergoes two successive transitions. The second laser diode signal has the logic level for turning the laser light source ON during a time from a start of the power set start signal to a time when the logic level of the monitor signal undergoes two successive transitions, and the second enable signal has the certain logic level for enabling the adjustment of the driving current during the entire time when the second laser diode signal has the logic level for turning the laser light source ON. According to the method of the present invention, it is possible to carry out the power set operation with a timing suited for the picture element density used. For this reason, it is possible to prevent a specific portion of the photosensitive body from becoming deteriorated and thus prevent an abnormal image formation which would occur if such a deterioration occurs. In addition, it is possible to expose the photosensitive body for the power set operation regardless of whether or not the power adjustment is completed at an intermediate portion of the photosensitive region.

A further object of the present invention is to provide an optical output control apparatus for controlling an optical output of a laser light source which scans a photosensitive body, comprising power monitor means for detecting an optical output of the laser light source and for generating a monitor signal which has a logic level indicative of whether a laser power of the optical output is greater than or less than a predetermined value, signal generating means supplied with the monitor signal, a synchronization detection signal indicative of each scanning line and a power set start signal indicative of a start of a power set operation in which the laser power is controlled to the predetermined value for generating signals including a gate signal indicative of a scan time in which the photosensitive body is scanned based on the synchronization detection signal, a laser diode signal having logic levels for turning the laser light source ON and OFF and an enable signal based on the monitor signal, the gate signal and the power set start signal, and power adjusting means supplied with the monitor signal and the enable for adjusting a driving current supplied to the laser light source based on the monitor signal when enabled by a certain logic level of the enable signal so as to control the laser power to the predetermined value. The laser diode signal has a logic level for turning the laser light source ON only during a time in which the gate signal has a predetermined logic level corresponding to the scan time in which the photosensitive body is scanned, and the enable signal has the certain logic level for enabling the adjustment of the driving current only when the gate signal has the predetermined logic level until the logic level of the monitor signal undergoes two successive transitions.

Another object of the present invention is to provide an optical output control apparatus for controlling an optical output of a laser light source which scans a photosensitive body, comprising power monitor means for detecting an optical output of the laser light source and for generating a monitor signal which has a logic level indicative of whether a laser power of the optical output is greater than or less than a predetermined value, signal generating means supplied with the monitor signal, a synchronization detection signal indicative of each scanning line and a power set start signal indicative of a start of a power set operation in which the laser power is controlled to the predetermined value for generating signals including a gate signal indicative of a scan time in which the photosensitive body is scanned based on the synchronization detection signal, first and second laser diode signals having logic levels for turning the laser light source ON and OFF and first and second enable signals based on the monitor signal, the gate signal and the power set start signal, selector means for selectively outtputting the first laser diode signal and the first enable signal respectively as a selected laser diode signal and a selected enable signa in a first mode and for outputting the second laser diode signal and the second enable signal respectively as the selected laser diode signal and the selected enable signal in a second mode, and power adjusting means supplied with the monitor signal and the enable signal outputted from the selector means for adjusting a driving current supplied to the laser light source based on the monitor signal when enabled by a certain logic level of the enable signal so as to control the laser power to the predetermined value. The first laser diode signal has a logic level for turning the laser light source ON only during a time in which the gate signal has a predetermined logic level corresponding to the scan time in which the photosensitive body is scanned, and the first enable signal has the certain logic level for enabling the adjustment of the driving current only when the gate signal has the predetermined logic level until the logic level of the monitor signal undergoes two successive transitions. The second laser diode signal has the logic level for turning the laser light source ON during a time from a start of the power set start signal to a time when the logic level of the monitor signal undergoes two successive transitions, and the second enable signal has the certain logic level for enabling the adjustment of the driving current during the entire time when the second laser diode signal has the logic leve for turning the laser light source ON.

Other objects and further features of the present invention will be apparent from the following detailed description when read in conjunction with the accompanying drawings.

DETAILED DESCIPTION

Figure 2:
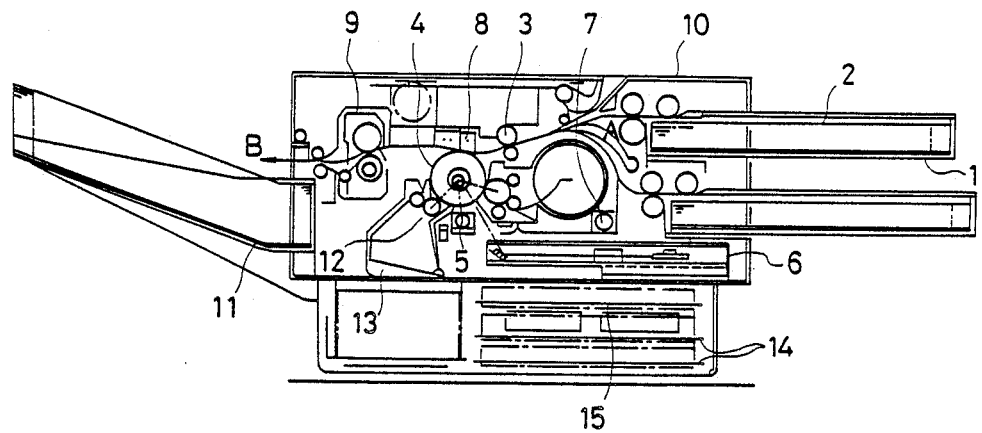
FIG. 2 is a side view in cross section generally showing a construction of a laser printer to which the present invention may be applied.

FIG. 2 is a side view in cross section generally showing a construction of a laser printer to which the present invention may be applied. In FIG. 2, a recording paper 2 supplied in a direction A from a paper supply device 1 is transported to a photosensitive drum 4 which with a timing determined by a pair of resist rollers 3. The photosensitive drum 4 is driven to rotate counterclockwise. An outer peripheral surface of the photosensitive drum 4 is charged by a charger 5 as the photosensitive drum 4 rotates, and a laser beam emitted from a laser light source of an optical system 6 is irradiated on the outer peripheral surface of the photosensitive drum 4 to form an electrostatic image thereon.

The electrostatic image is visualized into a toner image by a toner as it passes by a developing unit 7. The recording paper 2 is transported to the photosensitive drum 4 and the toner image is transferred onto this recording paper 2 by a transfer charger 8. The toner image which is transferred onto the recording paper 2 is fixed by a fixing unit 9, and the recording paper 2 is then supplied in a direction B to an ejection part 11.

On the other hand, after the toner image is transferred onto the recording paper 2, the outer peripheral surface of the photosensitive drum 4 is cleaned by a cleaning unit including cleaning blades 12 for removing residual toner on the photosensitive drum 4. The removed residual toner is recovered into a toner container 13.

A large portion of the laser printer is accommodated within a main printer body 10 as shown, and a controller 14 controls the operation of various parts of the laser printer.

Figure 3:
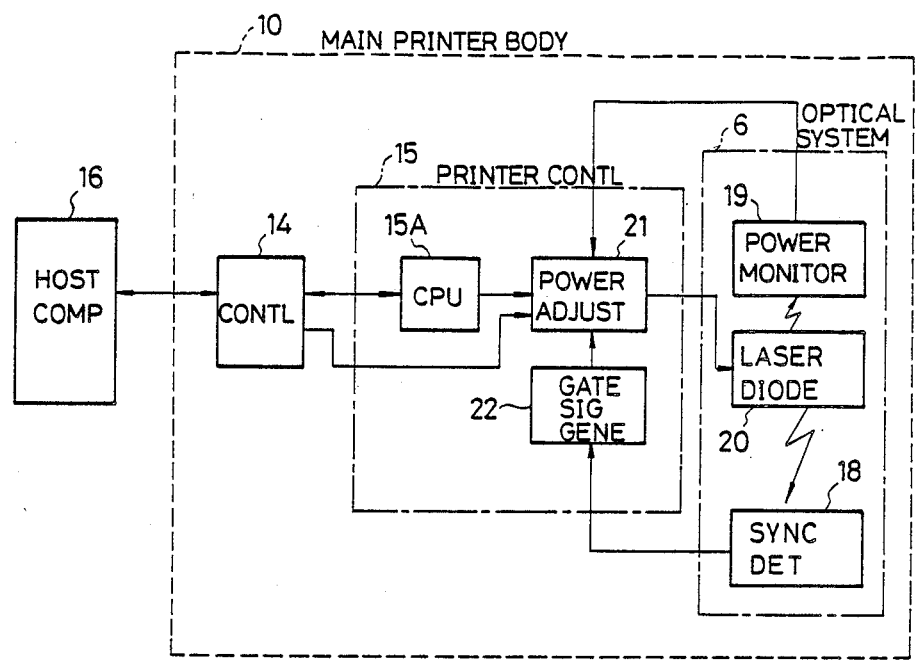
FIG. 3 is a system block diagram showing a first embodiment of a laser control apparatus according to the present invention applied to the laser printer shown in FIG. 2.

FIG. 3 shows a first embodiment of a laser control apparatus according to the present invention applied to the laser printer shown in FIG. 2 for carrying out a first embodiment of the method of controlling an optical output of a laser light source according to the present invention. In FIG. 3, those parts which are the same as those corresponding parts in FIG. 2 are designated by the same reference numerals, and a description thereof will be omitted.

In FIG. 3, the main printer body 10 has a controller 14 which is coupled to a host computer 16, a printer control part 15, and the optical system 6. A print data received by the main printer body 10 from the host computer 16 is converted into a video signal in the controller 14 and supplied to the printer control part 15. The printer control part 15 includes a central processing unit (CPU) 15A, a power adjusting part 21 and a gate signal generator 22. The optical system 6 includes a synchronization detector 18, a power monitor 19 and a laser diode 20 which is used as a laser light source. The power adjusting part 21 turns the laser diode 20 ON/OFF depending on the video signal.

Figure 4:
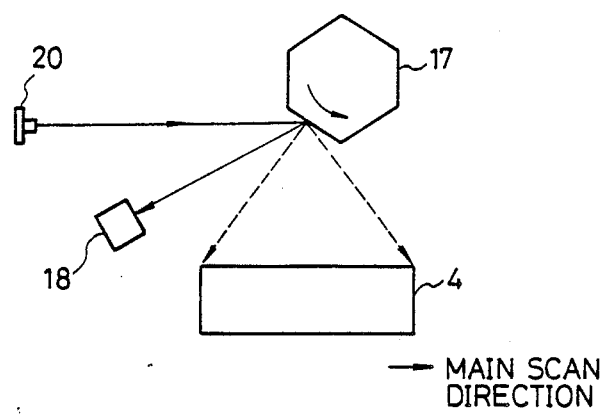
FIG. 4 is a diagram generally showing an optical system of the laser printer.

FIG. 4 generally shows the optical system 6. A laser beam emitted from the laser diode 20 hits a mirror surface of a polygonal mirror 17 which is used as a deflector. As the polygonal mirror 17 rotates, the outer peripheral surface of the photosensitive drum 4 is scanned in a main scanning direction (that is, in a longitudinal direction of the photosensitive drum 4) thereby forming an electrostatic image on the photosensitive drum 4. On the other hand, the synchronization detector 18 generates a synchronization detection signal once per scanning line and supplies this synchronization detection signal to the gate signal generator 22 so as to control the power set timing of the video signal, that is, control the timing with which the turning ON of the laser diode 20 starts.

In addition, the power monitor 19 of the optical system 6 monitors the laser beam emission by the laser diode 20. In other words, it is necessary to maintain the laser power of the laser diode 20 constant in order to obtain a stable image formation because seven when a current supplied to the laser diode 20 is kept constant the laser power may change with time and characteristics of laser diodes having identical structure are not necessarily identical.

Figure 5:
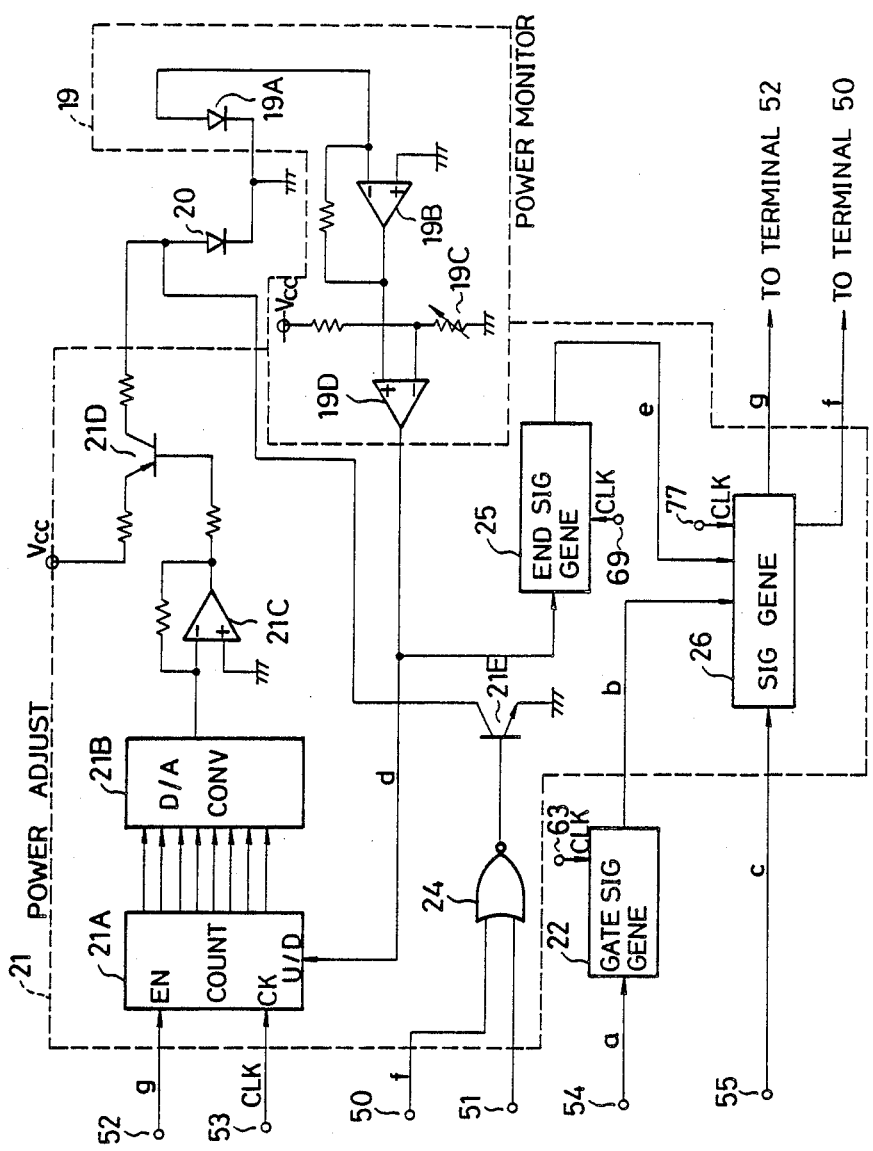
FIG. 5 is a system circuit diagram showing an embodiment of a power monitor, a power adjusting part and a gate signal generator shown in FIG. 3 together with a laser diode.

FIG. 5 shows an embodiment of the power monitor 19, the power adjusting part 21 and the gate signal generator 22 together with the laser diode 20. In FIG. 5, the power adjusting part 21 generally has an up/down counter 21A, a digital-to-analog (D/A) converter 21B, an operational amplifier 21C, transistors 21D and 21E, a NOR gate 24, an end signal generator 25 and a signal generator 26. The NOR gate 24 obtains a logical sum of a laser diode signal f shown in FIG. 6(F) and a video signal respectively obtained from terminals 50 and 51 so as to turn the laser diode 20 ON/OFF. The end signal generator 25 generates an end signal e shown in FIG. 6(E) when the level of a monitor signal d shown in FIG. 6(D) changes from a low level to a high level at a signal portion d1, that is, when two successive transitions of the monitor signal d occurs. The signal generator 26 generates an enable signal g and the laser diode signal f which respectively change from a low level to a high level at respective signal portions g1 and f1 shown in FIGS. 6(G) and 6(F) when a gate signal b shown in FIG. 6(B) changes from a low level to a high level at a signal portion b1, so as to turn the laser diode 20 ON. In addition, when the gate signal g changes from the high level to the level at a signal portion b2, the signal generator 26 generates the laser diode signal f which changes from the high level to the low level at a signal portion f2 so as to turn the laser diode 20 OFF. The enable signal g is supplied to a terminal 52. In FIG. 5, Vcc denotes a power source voltage.

The power monitor 19 generally has a pin photodiode 19A confronting the laser diode 20 for monitoring the laser power, an operational amplifier 19B, a variable resistor 19C for adjusting the laser power to a predetermined value and a comparator 19D.

Figure 1:
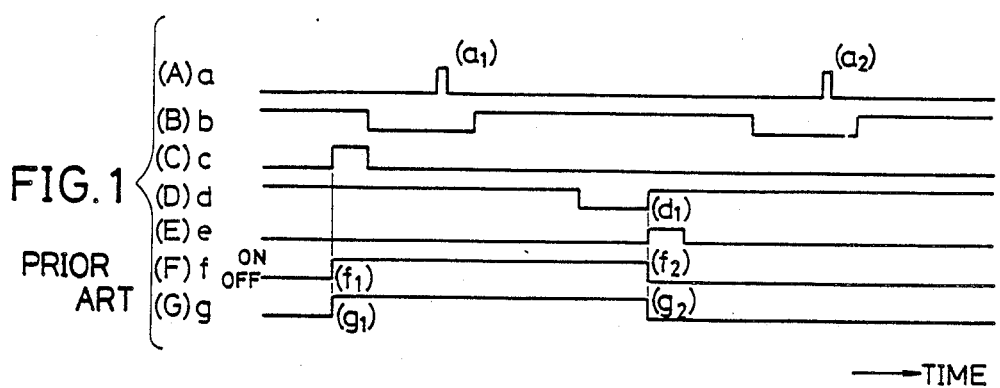
FIGS. 1(A) through 1(G) are timing charts for exlaining an example of a conventional method of controlling an optical output of a laser light source.
Figure 6:
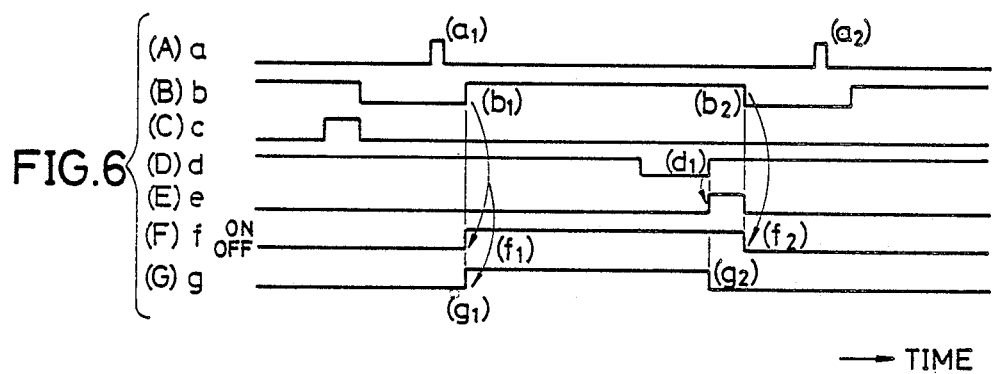
FIGS. 6(A) through 6(G) are timing charts for explaining an operation of the circuit system shown in FIG. 5.

Next, a description will be given of an operation of the circuit system shown in FIG. 5. When a power set start signal c shown in FIG. 6(C) is supplied to a terminal 55 from the CPU 15A shown in FIG. 3, the signal generator 26 generates the laser diode signal f and the enable signal g respectively shown in FIGS. 6(F) and 6(G) responsive to the power set start signal c. The enable signal g is supplied to an enable terminal EN of the up/down counter 21A through the terminal 52, and the up/down counter 21A is enabled during a high-level period of the enable signal g. When the monitor signal d shown in FIG. 6(D) and supplied to an up/down terminal U/D of the up/down counter 21A has a high level, the up/down counter 21A carries out a count-down in synchronism with a clock signal CLK which is supplied to a clock terminal CK through a terminal 53. On the other hand, the up/down counter 21A carries out a count-up in synchronism with the clock signal CK when the monitor signal d has a low level.

An output of the up/down counter 21A is supplied to the D/A converter 21B and is converted into an analog signal. The output current of the D/A converter 21B decreases when the up/down counter 21A carries out a count-down, and the operational amplifier 21C and the transistor 21D cooperate to increase a driving current of the laser diode 20 and increase the laser power. Similarly, the output current of the D/A converter 21B increases when the up/down counter 21A carries out a count-up, and the laser power is decreased. The monitor signal d which is produced in the power monitor 19 based on the detection of the pin photodiode 19A is supplied to the up/down terminal U/D of the up/down counter 21A and to the end signal generator 25.

The operational amplifier 19B and the comparator 19D control the level of the monitor signal d so that the monitor signal d has a high level when the output signal of the pin photodiode 19A is lower than a certain value set by the variable resistor 19C and has a low level when the output signal of the pin photodiode 19A is higher than this certain value. Hence, the laser power approaches the predetermined value and the end signal generator 25 generates the end signal e shown in FIG. 6(E) when the monitor signal d changes from the low level to the high level at a signal portion d1. As a result, the enable signal g generated from the signal generator 26 changes from the high level to the low level at a signal portion g2 responsive to this transition of the monitor signal d, and the power set operation is ended.

A synchronization detection signal a shown in FIG. 6(A) from the synchronization detector 18 shown in FIG. 3 is applied to a terminal 54 and supplied to the gate signal generator 22. An internal counter (not shown) of the gate signal generator 22 starts a counting operation responsive to the synchronization detection signal a, and the gate signal generator 22 generates the gate signal b shown in FIG. 6(B) which indicates a timing with which the laser beam emitted from the laser diode 20 scans the photosensitive drum 4. In other words, after the power set start signal c shown in FIG. 6(C) is received at the terminal 55, the power set operation is started in synchronism with the next rise b1 (high level) of the gate signal b by setting the enable signal g to the high level at a signal portion g1. Even when the power set operation ends before the fall b2 of the gate signal b and the enable signal g shown in FIG. 6(G) is set to the low level at a signal portion g2, the laser diode signal f shown in FIG. 6(F) is maintained at the high level so as to maintain the laser diode 20 ON until the fall b2 of the gate signal b. Accordingly, the laser diode signal f shown in FIG. 6(F) is kept to the high level to turn the laser diode 20 ON during the high-level period of the gate signal b which indicates the photosensitive drum scan region in one scanning line corresponding to an interval between the signal portions a1 and a2 of the synchronization detection signal a shown in FIG. 6(A). For this reason, it is possible to control the laser diode 20 in an optimum state even when the laser printer carries out the printing at a high printing speed with a high printing density.

Figure 7:
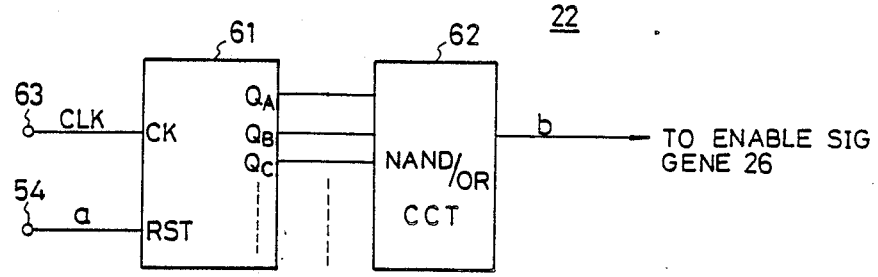
FIG. 7 is a circuit diagram showing an embodiment of the gate signal generator shown in FIG. 3.

FIG. 7 shows an embodiment of the gate signal generator 22. The gate signal generator 22 has a counter 61 and a NAND/OR circuit 62. The clock signal CLK is applied to a clock terminal CK of the counter 61 through a terminal 63, and the synchronization detection signal a from the terminal 54 is supplied to a reset terminal RST of the counter 61. Output signals $Q_A$, $Q_B$, $Q_C$, ... of the counter 61 are supplied to a NAND/OR circuit 62 which is a logic circuit including NAND and OR gates for generating the gate signal b shown in FIG. 6(B) with the timing shown based on the output signals of the counter 61.

Figure 8:
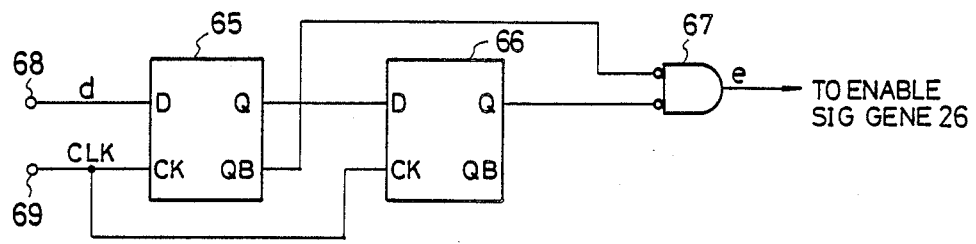
FIG. 8 is a circuit diagram showing an embodiment of the end signal generator shown in FIG. 3.

FIG. 8 shows an embodiment of the end signal generator 25. The end signal generator 25 has flip-flops 65 and 66, and a gate 67. The monitor signal d is supplied to a data input terminal D of the flip-flop 65 through a terminal 68. The clock signal CLK is supplied to clock terminals CK of the flip-flops 65 and 66 through a terminal 69. A Q-output of the flip-flop 65 is supplied to a data input terminal D of the flip-flop 66. The gate 67 generates the end signal e shown in FIG. 6(E) based on a $Q_B$-output of the flip-flop 65 and a Q-output of the flip-flop 66.

Figure 9:
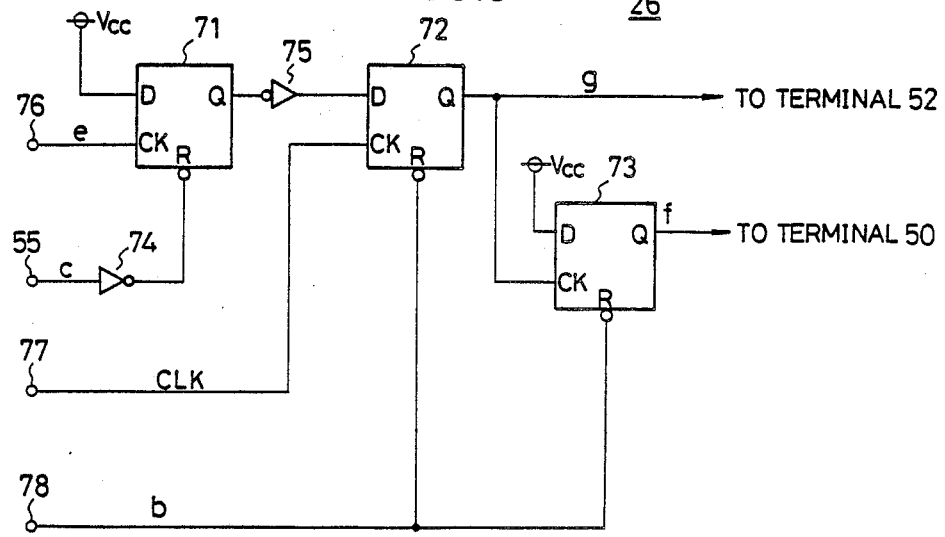
FIG. 9 is a circuit diagram showing an embodiment of the enable signal generator shown in FIG. 3.

FIG. 9 shows an embodiment of the signal generator 26. The signal generator 26 has flip-flops 71 through 73, and inverters 74 and 75. The power set start signal C from the terminal 55 is supplied to a reset terminal R of the flip-flop 71 through the inverter 74, and the end signal e is supplied to a clock terminal CK of the flip-flop 71 through a terminal 76. The power source voltage Vcc is supplied to a data input terminal D of the flip-flop 71. A Q-output of the flip-flop 71 is supplied to a data input terminal D of the flip-flop 72, and the clock signal CLK is supplied to a clock terminal CK of the flip-flop 72 through a terminal 77. The gate signal b is supplied to reset terminals R of the flip-flops 72 and 73 through a terminal 78, and a Q-output of the flip-flop 72 is outputted as the enable signal g. The Q-output of the flip-flop 72 is also supplied to a clock terminal CK of the flip-flop 73. The power source voltage Vcc is supplied to a data input terminal D of this flip-flop 73, and a Q-output of the flip-flop 73 is outputted as the laser diode signal f.

Figure 10:
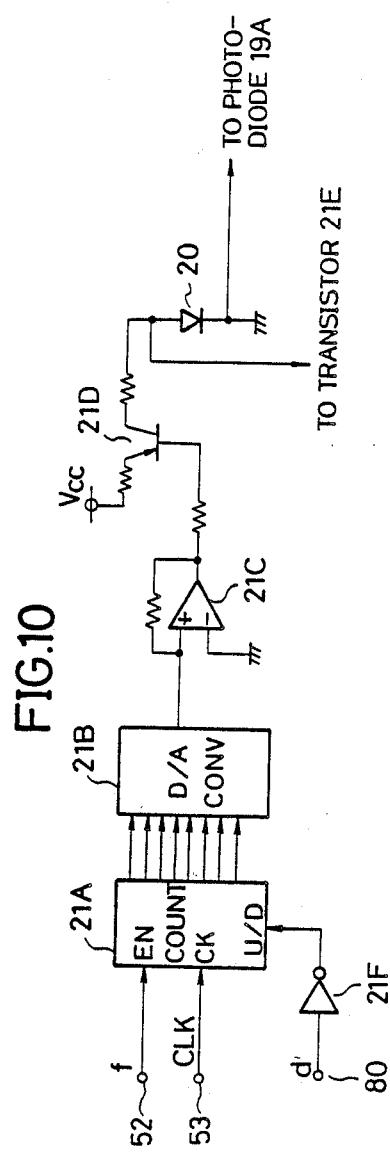
FIG. 10 is a system circuit diagram showing an essential part of another embodiment of the power adjusting part of the first embodiment shown in FIG. 3.
Figure 11:
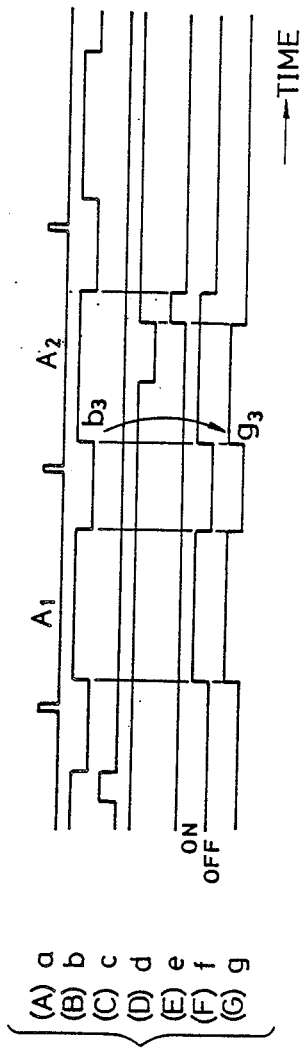
FIGS. 11(A) through 11(G) are timing charts for explaining a second embodiment of the method of controlling an optical output of a laser light source according to the present invention.

FIG. 10 shows an essential part of another embodiment of the power adjusting part 21 of the first embodiment shown in FIG. 3 together with the laser diode 20. In FIG. 10, those parts which are the same as those corresponding parts in FIG. 5 are designated by the same reference numerals, and a description thereof will be omitted. In FIG. 10, the power adjusting part 21 additionally has an inverter 21F. The monitor signal d shown in FIG. 6(D) is applied to a terminal 80 and is supplied to the up/down terminal U/D of the up/down counter 21A through this inverter 21F. Accordingly, the laser power of the laser diode 20 increases when the up/down counter 21A carries out a count-up, and the laser power of the laser diode 20 decreases when the up/down counter 21A carries out a count-down.

Next, a description will be given of a second embodiment of the method of controlling the optical output of the laser source according to the present invention. FIGS. 11(A) through 11(G) are timing charts for explaining this second embodiment of the method according to the present ivnention, and the same signal designations are used as in FIGS. 6(A) through 6(G). The first embodiment of the apparatus according to the present invention described in conjunction with FIGS. 3 through 5 may be employed to realize this second embodiment of the method according to the present invention.

FIGS. 11(A) through 11(G) respectively shown the signals a through g for a case where the power set operation does not end within one scanning line $A_1$. In this case, the enable signal g is set to the high level at a signal portion g3 in the next one scanning line $A_2$ when the gate signal b rises to the high level at a signal portion b3, so that the power set operation during the scanning line $A_2$ continues from the power value set by the power set operation which is carried out during the preceding scanning line $A_1$. The timing with which the power set operation is ended during the scanning line $A_2$ is similar to that of the first embodiment shown in FIGS. 6(A) through 6(G).

Figure 12:
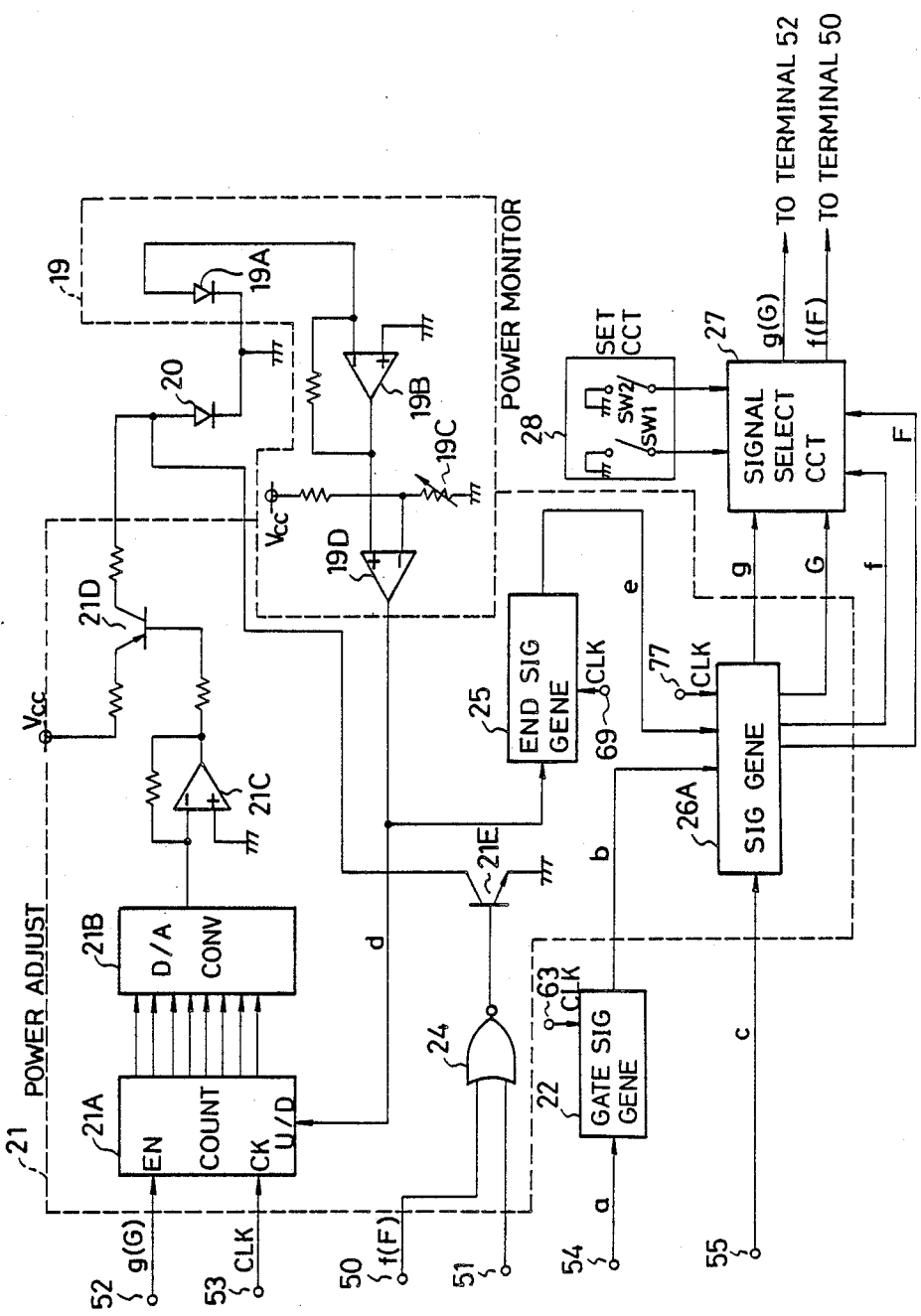
FIG. 12 is a system circuit diagram showing an essential part of a second embodiment of the laser control apparatus according to the present invention applied to the laser printer shown in FIG. 2.

Next, a description will be given of a second embodiment of the laser control apparatus according to the present invention applied to the laser printer shown in FIG. 2. FIG. 12 shows an essential part of the second embodiment of the laser control apparatus, and in FIG. 12, those parts which are the same as those corresponding parts in FIG. 5 are designated by the same reference numerals, and a description thereof will be omitted. The second embodiment of the laser control apparatus differs from the first embodiment of the laser control apparatus in that a signal generator 26A generates two kinds of enable signals g and G and two kinds of laser diode f and F, and that there are further provided a signal selection circuit 27 and a picture element density setting circuit 28.

Figure 13:
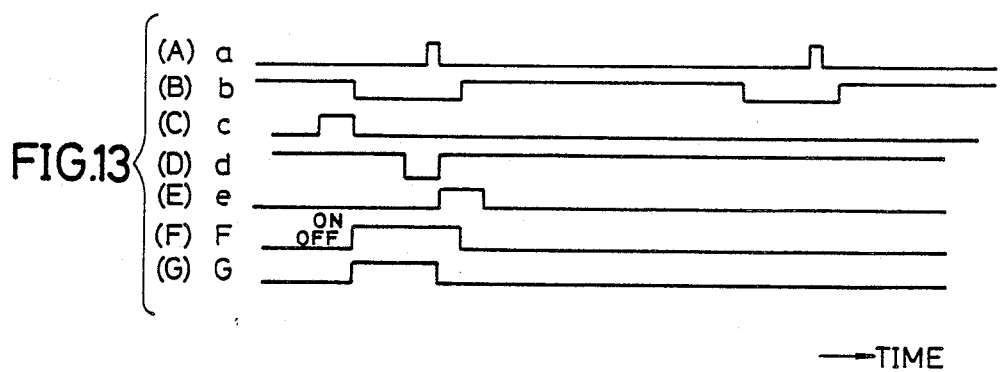
FIGS. 13(A) through 13(G) are timing charts for explaining an operation of the circuit system shown in FIG. 12.

In this embodiment, the signal generator 26a has a first circuit part for generating the laser diode signal f and the enable signal g respectively shown in FIGS. 6(F) and 6(G) and a second circuit part for generating the laser diode signal F and the enable signal G respectively shown in FIGS. 13(F) and 13(G). In other words, the first circuit part generates the high-level portion of the enable signal g within a predetermined range of the photosensitive drum scan region indicated by the high-level period of the gate signal b shown in FIG. 6(B). On the other hand, the second circuit part generates a high-level portion of the enable signal G within a predetermined range of the non-photosensitive drum scan region indicated by the low-level period of the gate signal b shown in FIG. 13(B). When the enable signal g or G has the high level, the laser diode 20 turned ON. But when the gate signal b changes to the low level, the corresponding laser diode signal f is set to the low level to turn the laser diode 20 OFF while the corresponding laser diode signal F is set to the high level.

FIGS. 13(A) through 13(E) respectively show the synchronization detection signal a, the gate signal b, the power set start signal c, the monitor signal d and the end signal e which are the same as the synchronization detection signal a, the gate signal b, the power set start signal c, the monitor signal d and the end signal e respectively shown in FIGS. 6(A) through 6(E).

Figure 14:
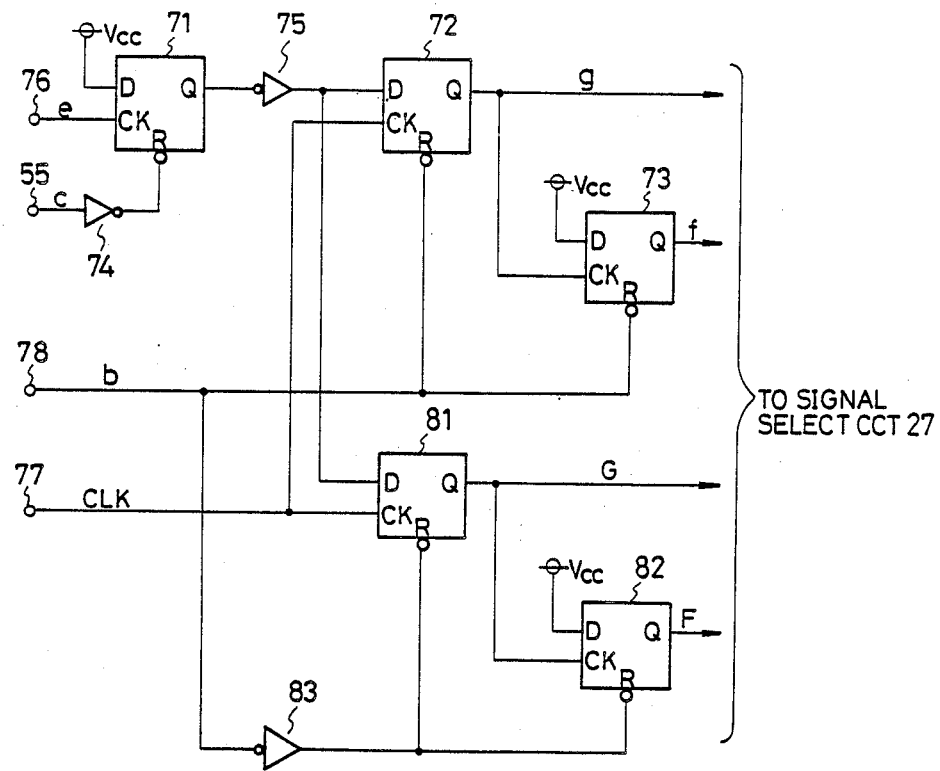
FIG. 14 is a circuit diagram showing an embodiment of an enable signal generator shown in FIG. 12.

FIG. 14 shows an embodiment of the signal generating circuit 26A. In FIG. 14, those parts which are the same as those corresponding parts in FIG. 9 are designated by the same reference numerals, and a description thereof will be omitted. In FIG. 14, the signal generating circuit 26A has in addition to those elements constituting the signal generating circuit 26 shown in FIG. 9 flip-flops 81 and 82 and an inverter 83. The output signal of the inverter 75 is supplied to a data terminal D of the flip-flop 81, and the clock signal CLK from the terminal 77 is supplied to a clock termina CK of the flip-flop 81. The gate signal b is supplied to reset terminals R of the flip-flops 81 and 82 through the inverter 83. A Q-output of the flip-flop 81 is outputted as the gate signal G shown in FIG. 13(G). This Q-output of the flip-flop 81 is also supplied to a clock terminal CK of the flip-flop 82. The power source voltage Vcc is supplied to a data input terminal D of the flip-flop 82. Hence, a Q-output of the flip-flop 82 is outputted as the laser diode signal F shown in FIG. 13(F).

The picture element density setting circuit 28 has switches SW1 and SW2 which are turned ON/OFF depending on the picture element density which is selected. The following Table shows an embodiment of the ON/OFF states of the switches SW1 and SW2 for the selected picture element density.

TABLE

| SW1 | SW2 | Picture Element Density |
|---|---|---|
| OFF | OFF | 300 dpi |
| ON | OFF | 240 dpi |
| OFF | ON | 400 dpi |
| ON | ON | 480 dpi |

The signal selection circuit 27 has a circuit construction for selectively outputting the signals f and g in a first mode and the signals F and G in a second mode. For example, in the case of a laser printer in which a scan time of a non-photosensitive region within one scanning line is long and the picture element density is low (for example, 240 or 300 dpi), the signal selection circuit 27 selectively outputs the signals F and G responsive to the ON/OFF states of the switches SW1 and SW2 so as to carry out the power set operation using the enable signal G shown in FIG. 13(G). On the other hand, in the case of a laser printer in which the scan time of the non-photosensitive region within one scanning line is short and the picture element density is high (for example, 400 or 480 dpi), the signal selection circuit 27 selectively outputs the signals f and g responsive to the ON/OFF states of the switches SW1 and SW2 so as to carry out the power set operation using the enable signal g shown in FIG. 6(G).

The high and low picture element densities respectively correspond to high and low rotational speeds of the polygonal mirror 17 shown in FIG. 4. That is, as the rotational speed of the polygonal mirror 17 increases, the scan time of the non-photosensitive region within one scanning line decreases. Accordingly, the picture element density setting circuit 28 shown in FIG. 12 may be replaced by a means for transmitting a rotational speed informatioin of the polygonal mirror 17.

The operation of the circuit system shown in FIG. 12 will be omitted because it is essentially the same as that of the first embodiment of the laser control apparatus described in conjunction with FIG. 5, except that the enable signal g (or G) applied to the terminal 52 and the laser diode signal f (or F) applied to the terminal 50 depend on the mode of the signal selectioin circuit 27 set responsive to the output of the picture element density setting circuit 28.

In the case where the enable signal G and the laser diode signal F are selectively outputted from the signal selection circuit 27, the power set operation is carried out during the low-level period of the gate signal b shown in FIG. 13(B). In other words, this power set operation is especially suited for a laser printer in which the scan time of the non-photosensitive region is long and the picture element density is low.

Further, the present invention is not limited to these embodiments, but various variations and modifications may be made without departing from the scope of the present invention.

What is claimed is:

1. A method of controlling an optical output of a laser light source which scans a photosensitive body, said method comprising the steps of:
   detecting an optical output of the laser light source and generating a monitor signal which has a logic level indicative of whether a laser power of the optical output is greater than or less than a predetermined value;
   generating signals including a gate signal indicative of a scan time in which the photosensitive body is scanned based on a synchronization detection signal indicative of each scanning line, first and second laser diode signals respectively having logic levels for turning the laser light source ON and OFF and first and second enable signals based on said monitor signal, said gate signal and a power set start signal indicative of a start of a power set operation in which the laser power is controlled to said predetermined value, said first laser diode signal having a logic level for tuning the laser light source ON during an entire time in which said gate signal has a predetermined logic level corresponding to the scan time in which the photosensitive body is scanned even when said monitor signal undergoes two successive transitions before an end of the time in which said gate signal has said predetermined logic level, said first enable signal having a logic level for enabling an adjustment of a driving current supplied to said laser light source only when said gate signal has said predetermined logic level until the logic level of said monitor signal undergoes two successive transitions, said second laser diode signal having the logic level for turning the laser light source ON during a time from a start of said power set start signal to a time when the logic level of said monitor signal undergoes two successive transitions, said second enable signal having a logic level for enabling the adjustment of said driving current during a time when said second laser diode signal has the logic level for turning the laser light surface ON;
   selectively outputting said first laser diode signal and said first enable signal respectively as a selected laser diode signal and a selected enable signal in a first mode and outputting said second laser diode signal and said second enable signal respectively as the selected laser diode signal and the selected enable signal in a second mode; and
   adjusting said driving current supplied to said laser light source based on said monitor signal when enabled by said enable signal so as to control the laser power to said predetermined value.

2. The method as claimed in clam 1 wherein said step of generating signals generates said second laser diode signal which has the logic level for turning the laser light source ON during a time in which said gate signal has a logic level other than said predetermined logic level and corresponding to a scan time in which a non-photosensitive region is scanned.

3. The method as claimed in claim 1 wherein said step of generating signals generates said first enable signal which has the certain logic level for enabling the adjustment of the driving current during each of times in which said gate signal has said predetermined logic level until the logic level of said monitor signal udergoes the two successive transitions within one of said times even when one logic level of said monitor signal spans two or more successive ones of said times in which said gate signal has said predetermined logic level.

4. The method as claimed in claim 1 wherein said step of selectively outtputting the laser diode signal and the enable signal makes the selective output in said first and second modes depending on a picture element density within one scanning line, said first mode using a high picture element density compared to said second mode.

5. An optical output control apparatus for controlling an optical output of a laser light source which scans a photosensitive body, said optical output control apparatus comprising:
   power monitor means for detecting an optical output of the laser light source and for generating a monitor signal which has a logic level indicative of whether a laser power of the optical output is greater than or less than a predetermined value;
   signal generating means supplied with said monitor signal, a synchronization detection signal indicative of each scanning line and a power set start signal indicative of a start of a power set operation in which the laser power is controlled to said predetermined value for generating signals including a gate signal indicative of a scan time in which the photosensitive body is scanned based on said synchronization detection signal, first and second laser diode signals having logic levels for turning the laser light source ON and OFF and first and second enable signals based on said monitor signal, said gate signal and said power set start signal;

selector means for selectively outputting said first laser diode signal and said first enable signal respectively as a selected laser diode signal and a selected enable signal in a first mode and for outputting said second laser diode signal and said second enable signal respectively as the selected laser diode signal and the selected enable signal in a second mode; and power adjusting means supplied with said monitor signal and the enable signal outputted from said selector means for adjusting a driving current supplied to said laser light source based on said monitor signal when enabled by a certain logic level of said enable signal so as to control the laser power to said predetermined value, said first laser diode signal having a logic level for turning the laser light source ON only during an entire time in which said gate signal has a predetermined logic level corresponding to the scan time in which the photosensitive body is scanned even when said monitor signal undergoes two successive transitions before an end of the time in which said gate signal has the predetermined level, said first enable signal havin the certain logic level for enabling the adjustment of the driving current only when said gate signal has said predetermined logic level until the logic level of said monitor signal undergoes two successive transitions, said second laser diode signal having the logic level for turning the laser light source ON during a time from a start of said power set start signal to a time when the logic level of said monitor signal undergoes two successive transitions, said second enable signal having the certain logic level for enabling the adjustment of the driving current during a time when said second laser diode signal has the logic level for turning the laser light source ON.

6. The optical output control apparatus as claimed in claim 5 wherein said signal generating means generates said second laser diode signal which has the logic level for turning the laser light source ON during a time in which said gate signal has a logic level other than said predetermined logic level and corresponding to a scan time in which a non-photosensitive region is scanned.

7. The optical output control apparatus as claimed in claim 5 wherein said signal generating means generates said first enable signal which has the certain logic level for enabling the adjustment of the driving current during each of times in which said gate signal has said predetermined logic level until the logic level of said monitor signal undergoes the two successive transitions within one of said times even when one logic level of said monitor signal spans two or more successive ones of said times in which said gate signal has said predetermined logic level.

8. The optical output control apparatus as claimed in claim 5 wherein said selector means makes the selective output in said first and second modes depending on a picture element density within one scanning line, said first mode using a high picture element density compared to said second mode.

9. The optical output control apparatus as claimed in claim 8 which further comprises setting means for setting the picture element density and for outputting a control signal indicative of the set picture element density, said control signal setting said selector means in said first mode when said control signal indicates the high picture element density and otherwise setting said selector means in said second mode.

* * * * *